United States Patent [19]

Tuan

[11] Patent Number: 4,752,814
[45] Date of Patent: Jun. 21, 1988

[54] HIGH VOLTAGE THIN FILM TRANSISTOR

[75] Inventor: Hsing C. Tuan, Palo Alto, Calif.

[73] Assignee: Xerox Corporation, Stamford, Conn.

[21] Appl. No.: 839,403

[22] Filed: Mar. 14, 1986

Related U.S. Application Data

[63] Continuation of Ser. No. 588,485, Mar. 12, 1984, abandoned.

[51] Int. Cl.[4] .................. H01L 29/78; H01L 27/04
[52] U.S. Cl. ...................................... 357/23.7; 357/2; 357/59; 357/23.8
[58] Field of Search .................... 357/23.7, 59 B, 2, 4, 357/23.8

[56] References Cited

U.S. PATENT DOCUMENTS

| | | | |
|---|---|---|---|
| 3,493,812 | 2/1970 | Weimer | 357/32 |
| 4,172,260 | 10/1979 | Okabe et al. | 357/54 |
| 4,507,845 | 4/1985 | McIver | 357/22 I |
| 4,547,789 | 10/1985 | Cannella et al. | 357/2 |
| 4,551,904 | 11/1985 | Berenz et al. | 357/22 K |
| 4,601,096 | 7/1986 | Calviello | 357/22 K |

FOREIGN PATENT DOCUMENTS

| | | | |
|---|---|---|---|
| 56-187051 | 5/1983 | Japan | 357/23.14 |
| 2067353 | 7/1981 | United Kingdom | 357/2 |

OTHER PUBLICATIONS

Sze, Physics of Semiconductor Devices (1st Ed., Wiley, NY, 1969), pp. 568-569.
Electronics & Communications in Japan, vol. 644, No. 12, Dec. 1981, pp. 96-104, Scripta Publishing Co., Silver Spring, Maryland, I. Yoshida et al.: "A Composite Gate Structure for Enhanced-Performance Power MOS FET's": p. 97, para 2, p. 98, FIG. 2.
Proceedings of the 14th Conference (1982 International) on Solid State Devices, Tokyo, 1982, Japanese Journal of Applied Physics, vol. 22, 1983, Supplements No. 22-1, pp. 487-491, Tokyo, JP, M. Matsumura, "Amorphous Silicon Transistors and Integrated Circuits": FIG. 1.

Primary Examiner—William D. Larkins
Attorney, Agent, or Firm—Serge Abend

[57] ABSTRACT

A high voltage amorphous silicon thin film transistor including a gate electrode which controls the injection of charge carriers from a superimposed n+ doped amorphous silicon source electrode into an amorphous silicon charge carrier transport layer, spaced from the gate electrode by a dielectric layer, for causing current conduction through the transport layer to a laterally offset drain electrode. The source electrode is in charge injecting contact with the transport layer and the drain electrode is in collecting contact with the transport layer.

20 Claims, 3 Drawing Sheets

HIGH VOLTAGE THIN FILM TRANSISTOR

This is a continuation, of application Ser. No. 588,485, filed Mar. 12, 1984, now abandoned.

This invention relates to high voltage thin film transistors and, more particularly, to devices which rely upon the unique properties of amorphous semiconductor materials.

Amorphous silicon thin film transistor (a-Si:H TFT) technology has matured significantly in the past several years. This is largely due to its simple, inexpensive and low temperature fabrication processes, which allow it to be deposited uniformly over large-area non-crystalline substrates, such as glass and ceramics. Thus, a Si:H TFTs are particularly suitable for large-area electronics applications. In view of these attributes, it would be highly desirable to be able to provide large-area arrays of high voltage (i.e. above 500 volts) amorphous silicon transistor switches for driving electrographic stylii, wherein each individual writing stylus is controlled by its own switch. Such a arrangement would eliminate the more complex and expensive multiplexing schemes presently employed.

Today, the only commonly available high voltage integrated circuit devices utilize crystalline silicon technology. However, because of the processing limitations of this material, coupled with the need to incorporate structural safeguards to maximize the drain breakdown voltage, they are generally complex and, therefore, expensive.

Various solutions have been achieved. For example, one approach has been to provide a thin gate oxide layer, for allowing low voltage switching operation, and offsetting the drain electrode from the gate, while ion implanting the offset region to form a shallow diffused resistor, for lowering the field seen by the gate. The doping step for the diffused resistor region is extremely critical. Another approach has been to deposit a thick protective oxide layer between the drain and the gate and to deposit a polysilicon load resistor over the oxide. These also require critical doping of the diffused resistor as well as requiring thick dielectric layers on the order of one micron. It should be apparent that the known solutions for providing high voltage transistors in crystalline silicon are complex and expensive.

Perhaps a more prejudicial factor regarding crystalline silicon high voltage transistors is the wafer size limitation of about three to four inches, which militates against full page-width switch arrays. Of course, wafer interconnection, for providing eleven inch page-widths or a thirty-six inch plotter-widths, is possible, however it would necessitate further expenses.

In order for a high voltage transistor to operate satisfactorily, it is important that the transistor may be switched ON and OFF by a low voltage gate signal, so that the gate may rapidly be brought up to switching potential. Clearly, the higher the switching potential on the gate, the longer it takes to effect.

It is an object of the present invention to provide a simply processed, low cost high voltage thin film transistor which is capable of being fabricated in large-area arrays.

It is a further object of the present invention to provide a high voltage thin film transistor utilizing amorphous silicon technology.

These and other objects may be carried out, in one form, by providing a high voltage thin film transistor including a source electrode and a drain electrode spaced relative to one another in a lateral direction, the source electrode is also spaced relative to a gate electrode in a direction normal to the lateral direction and the source electrode and gate electrode are superimposed upon one another. A charge carrier transport layer extends laterally between and is in intimate physical and electrical contact with the source electrode and the drain electrode, and is positioned between the gate electrode and the source electrode. The charge carrier transport layer is highly resistive and will only allow significant current to flow therethrough after charge carriers are injected therein. A dielectric layer is located between the gate electrode and the charge carrier transport layer. The gate electrode controls the injection of charge carriers from the source electrode into the charge carrier transport layer for causing current conduction therethrough.

A more complete understanding of the present invention and its attendant advantages may be obtained by reference to the following description taken in conjunction with the accompanying drawings in which.

The principle of operation of the a-Si:H TFT device of this invention depends upon the unique flexibility and simplicity of processing steps available to the fabrication of amorphous silicon devices and upon the somewhat unique transport properties of the amorphous silicon. Since it can be deposited uniformly, at relatively low temperatures (on the order of less than 350° C.), over large area non-crystalline substrates such as glass and ceramics, a large-area array of transistor structures, of the form described below, can be readily made. The two characteristics of amorphous silicon which are relied upon to enable operation of the unique device described herein, are the extremely high resistivity of the amorphous silicon material, causing it to behave similar to a dielectric material, and its ability to allow charge carriers to drift therethrough and cause current conduction once charge carriers are injected into it.

Figure 1:
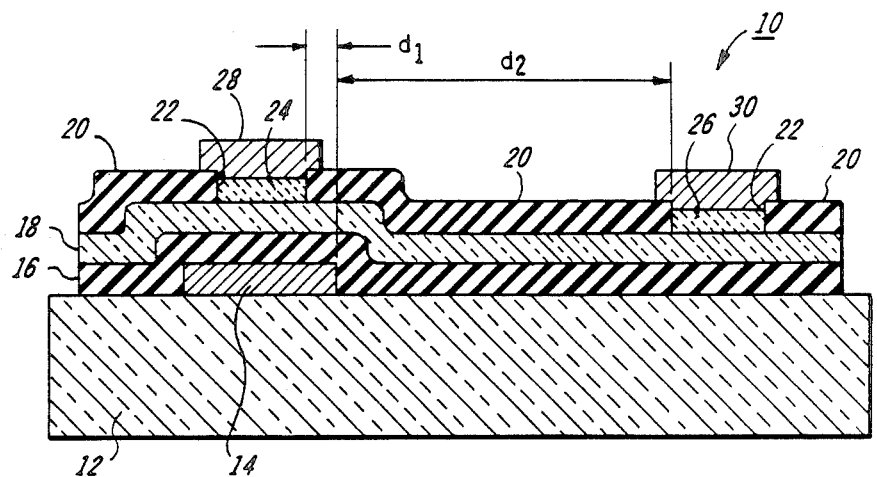
FIG. 1 is a schematic cross-sectional view of one form of the amorphous semiconductor thin film high voltage transistor of this invention.

Turning now to the drawings, there is illustrated in FIG. 1 a device 10 comprising a substrate 12 made of any suitable material, such as glass or ceramic, upon which is deposited a thin metal layer 14 patterned to form the gate electrode of the device. The gate electrode 14 may be made of any suitable material, such as Cr, NiCr, or other material. Overlying the gate and substrate, is a layer of gate dielectric material 16, usually silicon nitride or silicon dioxide. An undoped, or very lightly doped, amorphous silicon layer 18 lies upon the dielectric layer 16 and is covered by a passivation dielectric layer 20 usually, but not necessarily, of the same material as the gate dielectric 16. Windows 22 etched into the passivation layer 20 provide openings for the source electrode 24 and drain electrode 26. The source electrode is preferably amorphous silicon suitably doped to provide charge carriers of the desired type, i.e. electrons (N+) or holes (p+). Finally, metal source and drain contacts, 28 and 30, respectively, of a suitable conductive material, such as Al, overlie the source and drain electrodes 24 and 26. The source contact is usually connected to ground, or to a suitable reference potential; the drain contact is usually connected, through a load resistor, to a high voltage supply (on the order of several hundred volts) of a suitable polarity, with respect to the polarity of the charge carriers (positive for electron carriers or negative for hole carriers); and the gate is connected to a switchable low voltage supply (on the order of five to fifteen volts).

As illustrated in FIG. 1, the source electrode 24 and the gate electrode 14 are both laterally offset from the drain electrode 26, and the gate electrode 14 underlies the source electrode. The gate electrode is somewhat larger than the source electrode and, in particular, extends a short distance beyond the source electrode toward the drain electrode, a distance $D_1$. A distance $d_2$ separates the right edge of the gate electrode from the left edge of the drain electrode. As will become apparent, when the theory of operation is discussed below, while it is desirable that the gate electrode extends closer to the drain electrode than does the source electrode, a gate/source overlap is not absolutely imperative for adequate functioning of the device. However, it is necessary that the edges of the source and gate electrodes facing the drain electrode are at least aligned, in order that the gate electrode may function to switch the transistor completely OFF.

Figure 2:
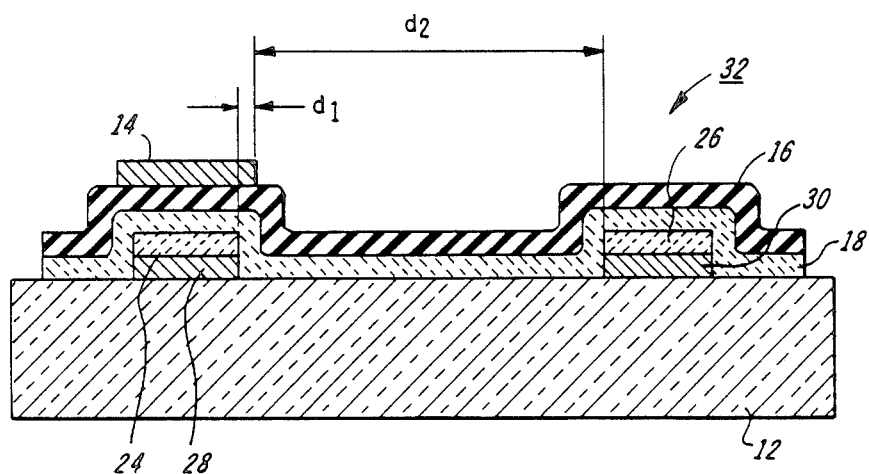
FIG. 2 is a schematic cross-sectional view of another form of the amorphous semiconductor thin film high voltage transistor of this invention.

If the proposed relationship between the several elements is observed, any number of variations, in the configuration of the thin film high voltage transistor of this invention, are possible. For example, in FIG. 2 there is illustrated an inverted device 32, wherein the source and drain are positioned directly upon the substrate. For clarity, the same numerals have been applied as in FIG. 1.

The undoped, or lightly doped, amorphous silicon layer 18 has an extremely high, dark resistivity (typically greater than $10^9$ ohm-cm). Current conduction therein in the ohmic regime, by thermally generated carriers, is so insignificant that, for practical purposes, it essentially can be considered as an insulating layer, as far as the population of conduction carriers is concerned. Normally, a high barrier to the movement of carriers exists across the interface between the n+ amorphous silicon source electrode and the amorphous silicon charge transport layer. However, absent additional controls, a sufficiently large positive potential on the remote drain electrode will usually be able to draw some electrons out of the source electrode and into the amorphous silicon transport layer. As will be explained below, the gate electrode serves to control the injection of charge carriers across the source electrode interface, thereby controlling both the ON and OFF current through the amorphous silicon layer.

Just as in a vacuum tube, a potential difference alone between two electrodes, does not result in current conduction through the vacuum, the very high resistivity of the amorphous silicon layer will normally prevent current conduction between the source and the drain electrodes. Continuing with the vacuum tube analogy, it is well known that electrons can travel through the vacuum, causing current conduction, under the influence of an electric field, once they are injected into the vacuum. In order to inject electrons into the vacuum, a heated cathode is provided adjacent one of the electrodes, and a grid, or other control device, allows electrons to enter the region between the electrodes and be swept between them by the high potential field. Similarly, carriers can drift through amorphous silicon layer 18 and provide current conduction, once they are injected therein.

Since the source electrode is separated from the gate electrode by several thousand Angstroms and is separated from the drain electrode by several microns, the effect of a low potential on the gate will prevail over the high potential on the drain. Thus, control of charge injection of electron charge carriers, supplied by the n+ doped amorphous silicon source electrode 24, is accomplished by the gate electrode 14.

In the OFF state, a potential of zero volts, or of a low negative voltage, is applied to the gate electrode to suppress electron carrier injection from the source electrode into the amorphous silicon. In the ON state, a positive voltage, on the order of five to fifteen volts, is applied to the gate electrode. This attracts electrons across the interface from the source electrode into the amorphous silicon charge carrier transport layer. Once the electrons are in the amorphous silicon layer they will be further attracted by the drain potential and cause current flow.

The degree of control exercised by the gate electrode, upon the injection and suppression of charge carriers, is greatly dependent upon the spatial relationship between the gate and source electrodes. If, as shown in FIG. 1, the gate electrode completely spans the source electrode it will exert maximum control thereover. However, if the source electrode extends beyond the gate electrode, in the direction toward the drain electrode, those portions will not be substantially influenced by the gate electrode. Those extending portions will fall under the influence of the high voltage drain electrode which will effect injection of charge carriers into the transport layer, independent of the gate electrode state. The extent of the effect will depend on the proximity of the extending portion of the source electrode to the drain electrode. Nevertheless, the gate electrode would not be effective to establish a completely OFF condition.

If the gate electrode extends beyond the source electrode in the direction of the drain electrode (as shown), an additional benefit is achieved by the effect of the gate voltage on the amorphous silicon charge carrier transport layer. In the ON condition, the positive gate voltage forms an electron accumulation zone in the $d_1$ region of the amorphous silicon transport layer and effectively extends the source electrode to the right edge of the gate electrode. The electrons now only have to drift across the distance $d_2$ to reach the drain electrode, enabling the drain electrode to extract electrons at a lower drain voltage. Conversely, in the OFF condition, the zero, or negative, gate voltage further depletes the transport layer by driving electrons out of its $d_1$ region and increases the effective distance between the source and drain electrodes. A larger effective separation between the source and drain electrodes decreases the electric field, along the conduction path, in the amorphous silicon transport layer and further undermines the effectiveness of the high drain voltage to extract electrons from the source electrode.

Figure 4:
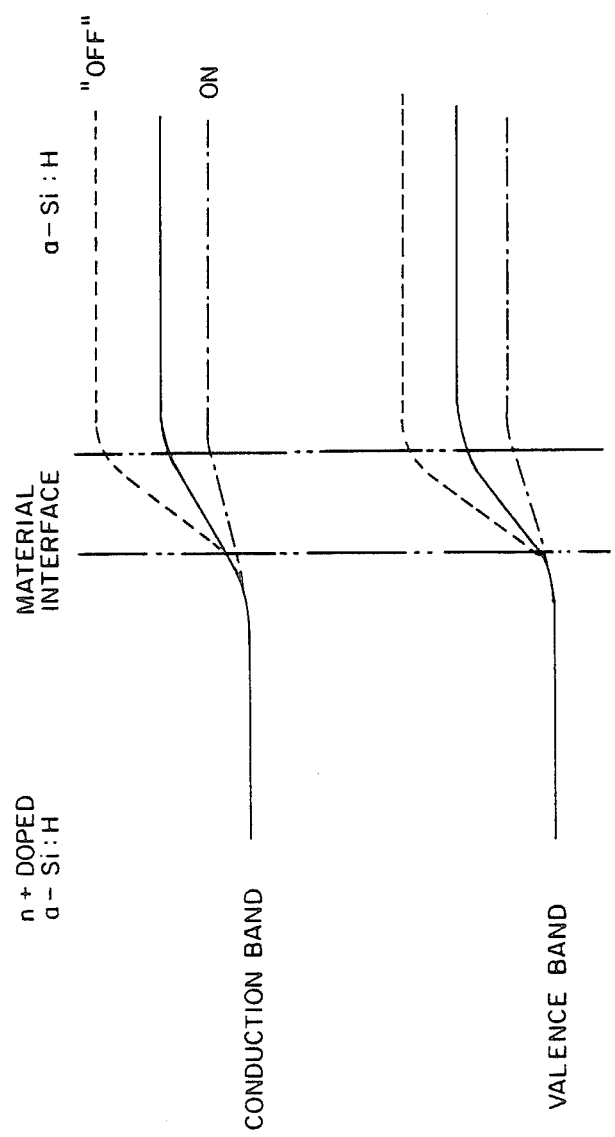
FIG. 4 is a graphical representation of the output characteristics of a typical amorphous semiconductor thin film high voltage transistor of this invention.

The above-described effects, of the gate electrode upon the charge injection properties from the n+ source electrode into the amorphous silicon transport layer, rely upon the band bending phenomenon illustrated in FIG. 4. As shown in that drawing, a pair of phantom vertical lines, approximately centrally spaced, represents the interface zone between the amorphous silicon transport layer 18 and the n+ doped amorphous silicon source electrode. For each material, a conduction band and a valence band is shown, separated by an energy bandgap. It should be noted that at the interface there is a built-in potential barrier, as represented by the slope of the curves in the interface zone.

Band bending is illustrated by three pairs of conduction and valence bands at the interface and in the regions adjacent the interface between the $n+$ doped amorphous silicon source electrode and the amorphous silicon transport layer. The central pair (solid lines) represents a thermal equilibrium condition when no potential is applied to the gate electrode. An upper pair (dotted lines) represents the result of band bending when the gate electrode has a low negative voltage applied (the OFF condition), indicating an increased barrier to injection of electrons from the source electrode. The lower pair (double dotted lines) represents the result of band bending when the gate electrode has a low positive voltage applied (the ON condition), indicating a decreased barrier to injection of electrons from the source electrode. In this state, electrons are readily injected into the amorphous silicon transport layer.

Figure 5:
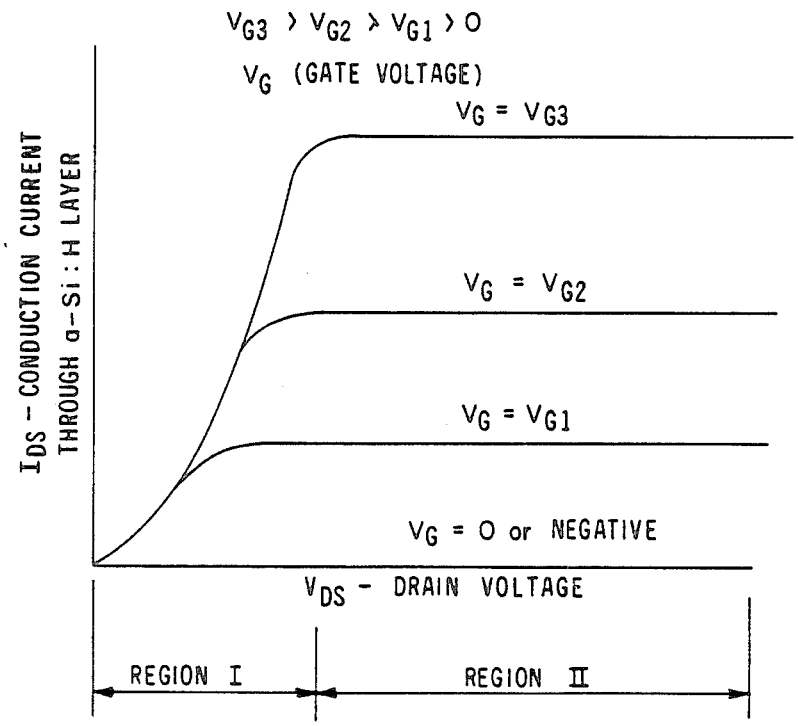
FIG. 5 is a graphical representation of the band bending phenomenon upon which this invention relies.

In FIG. 5 the electrical characteristics of the high voltage thin film transistor of the present invention are illustrated. Drain current $I_{DS}$ is plotted against source-drain voltage $V_{DS}$, for various gate voltages $V_G$. For low values of $V_{DS}$ (in Region I) the low drain voltages are not large enough to remove injected electrons, across the amorphous silicon transport layer, at a fast enough rate. Thus, electrons injected from the source into the amorphous silicon transport layer will bunch-up, further inhibiting injection. This condition is apparent, since for each increment of increase in voltage there is a corresponding increase in current. However, in Region II, $V_{DS}$ is large enough to move essentially all the electrons injected from the source across the amorphous silicon transport layer. This condition is apparent, since for increases in $V_{DS}$, $I_{DS}$ stays essentially flat. In Region II, $I_{DS}$ is only limited by the ability of the source electrode to inject electrons, as governed by the gate voltage $V_G$.

In order to achieve maximum drain current for a given drain voltage and gate voltage, the transistor should be operated in Region II. If the dimension $d_2$ of the transistor is too long, the drain electrode will be so far from the source electrode that the electric field, seen by the electrons injected into the amorphous silicon transport layer, will be too small to transport all the injected electrons thereacross, i. e. the transistor will be operating in Region I. On the other hand, if the dimension $d_2$ is too short, the gate dielectric layer 16 will not sustain the high potential between the drain electrode and the gate electrode, and breakdown will occur between the drain and the gate. Thus, it should be apparent that a balance must be struck in selecting this dimension. Additionally, in order to prevent air breakdown between the source and rain contacts, a high dielectric strength layer would be used to coat the device.

A representative example of some approximate dimensions which have been used in a successful device is as follows: the gate electrode layer was 800 Å thick, the gate dielectric layer, the amorphous silicon layer and the passivation dielectric layer were on the order of 1000 to 3000 Å thick, the n+ doped amorphous silicon source and drain electrodes were on the order of 500 to 1000 Å thick, the metal source and drain contact layers were thick enough for complete step coverage, and the dimension $d_1$ was approximately 5 microns. The distance $d_2$ was 10 to 30 microns.

Under these conditions, a +600 volt potential applied to the drain electrode had a tendency to draw electrons out of the source electrode and into the amorphous silicon layer. But, since the drain electrode is about one hundred times further away from the source electrode than is the gate electrode, the gate electrode with only zero or −5 volts applied thereto was sufficient to suppress electron charge injection and maintain the OFF state.

The flexibility of the fabrication processes available for amorphous silicon devices allows this unique structure to be made. As fully described above, this device relies upon the sandwiching of an undoped, or lightly doped, amorphous silicon layer 18 between a conductive gate electrode 14 and an n+ doped source electrode 24, in order that the gate electrode can control injection from the facing surface of the source electrode. A dielectric layer, separating the gate electrode from the amorphous silicon transport layer, prevents the gate electrode from drawing any current from the circuit and requires that the injected electrons be transported to the drain electrode. Such a construction is not possible in single crystal silicon where the stating material is the silicon wafer and all features are either diffused downward from the surface or built upward thereon. With amorphous silicon, the starting material may be any suitable substrate upon which metal layers, dielectric layers and amorphous silicon layers (doped, undoped or lightly doped) may be deposited, at relatively low temperatures, in any desired order.

Figure 3:
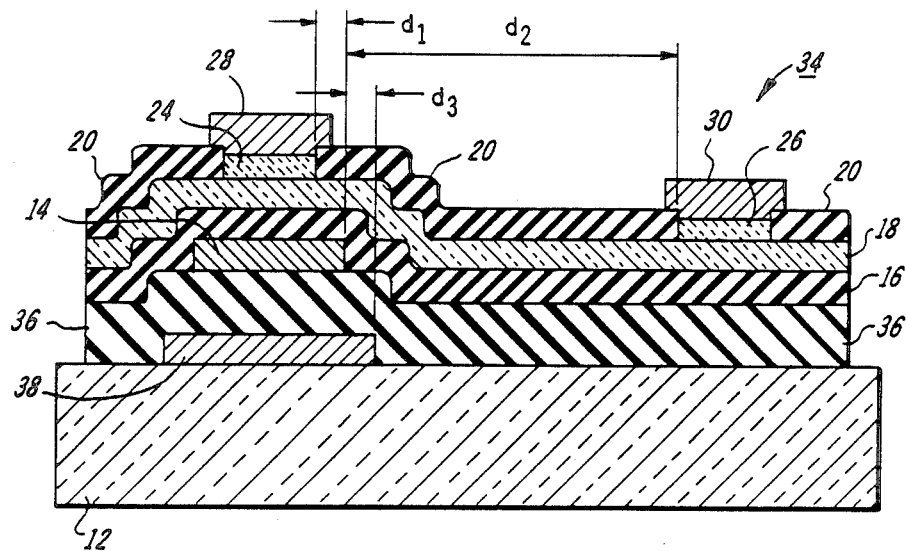
FIG. 3 is a schematic cross-sectional view of yet another form of the amorphous semiconductor thin film high voltage transistor of this invention.

The embodiment of FIG. 3 is suggested as an alternative construction which further increases the breakdown voltage. Since the high voltage thin film transistor 34 includes the same arrangement of elements as does transistor 10 (FIG. 1), with but one modification, the same numerals will be used to identify the same parts. An additional gate electrode 38, separated from the gate electrode 14 by a thick dielectric gate electrode layer 36 (about 1 to 2 microns), extends closer to the drain electrode, than does the gate electrode 14, by the dimension $d_3$. The additional gate electrode 38 is maintained at the source electrode potential (usually ground) and thereby causes the potential of the amorphous silicon charge transport layer 18 in the $d_3$ region to be low, thus reducing the possibility of breaking down the thinner first dielectric layer 16.

A novel high voltage amorphous silicon thin film transistor has been described. In it, a gate electrode is employed to control the carrier injection efficiency of the source electrode. The main current conduction mechanism of the present high voltage transistor device is by the drift of carriers through a highly resistive amorphous silicon layer. Also, by judicious selection of the dimensions and the relative positioning of the various elements the virtual distances between the elements may be modified to the advantage of the device.

It should be understood that the present disclosure has been made only by way of example and that numerous changes in details of construction and the combination and arrangement of device elements may be resorted to without departing from the true spirit and the scope of the invention as hereinafter claimed.

What is claimed is:

1. A thin film high voltage transistor characterized by including a substrate upon which are supported source electrode means and drain electrode means spaced relative to one another in a lateral direction by a first distance, gate electrode means spaced from said source electrode means in a direction normal to said lateral direction by a second distance, said source electrode means and said gate electrode means are in superimposed relationship to one another and are at least partially over-lapping, and said gate electrode means is spaced from said drain electrode means in said lateral direction by a distance approximately equal to said first distance, charge carrier transport means extending laterally between and in intimate physical and electrical contact with said source electrode means and said drain electrode means, said charge carrier transport means being positioned between said gate electrode means and said source electrode means, said charge carrier transport means being made of a non-single crystalline material having substantially intrinsic semiconductor properties, and dielectric means located between said gate electrode means and said charge carrier transport means.

2. The high voltage transistor as recited in claim 1 characterized in that said source electrode means and said charge carrier transport means are in charge injecting contact and said drain electrode means and said charge carrier transport means are in charge collecting contact.

3. The high voltage transistor as recited in claim 2 characterized in that said charge carrier transport means comprises an amorphous silicon layer.

4. The high voltage transistor as recited in claim 3 characterized in that said source electrode means and said drain electrode means comprise n+ amorphous silicon.

5. The high voltage transistor as recited in claim 4 characterized in that said gate electrode means is electrically conductive.

6. The high voltage transistor as recited in claim 3 characterized in that said first distance is about a hundred times greater than said second distance.

7. The high voltage transistor as recited in claim 6 characterized in that a switching potential applied to said gate electrode means having a magnitude of about one-hundredth that of a drain potential applied to said drain electrode means controls current flow through said transistor.

8. The high voltage transistor as recited in claim 2 characterized in that the spacing of the closest portion of said gate electrode means from said drain electrode means in said lateral direction is less than said first distance.

9. The high voltage transistor as recited in claim 2 characterized by further including second gate electrode means spaced from said gate electrode means in the direction normal to said lateral direction and superimposed upon said gate electrode means, and second dielectric means located between said gate electrode means and said second gate electrode means, said second gate electrode means being electrically connected to said source electrode means and extending closer to said drain electrode means in said lateral direction than does said gate electrode means.

10. The high voltage transistor as recited in claim 9 characterized in that the thickness of said second dielectric means is about an order of magnitude less than the distance between said drain electrode means and the closest portion of said gate electrode means.

11. The high voltage transistor as recited in claim 1 characterized in that said charge carrier transport means comprises an amorphous semiconductor material.

12. The high voltage transistor as recited in claim 2 characterized in that the spacing of the closest portion of said gate electrode means from said drain electrode means in said lateral direction is equal to said first distance.

13. The high voltage transistor as recited in claim 2 characterized in that the spacing of the closest portion of said gate electrode means from said drain electrode means in said lateral direction is greater than said first distance.

14. A thin film high voltage transistor characterized by including a substrate, source electrode means and drain electrode means supported by said substrate and positioned so that the closest portions of said source electrode means and said drain electrode means are separated from one another, in a lateral direction, by a major distance, gate electrode means supported by said substrate and positioned so that the closest portions of said gate electrode means and said drain electrode means are also separated from one another, in the lateral direction, by a distance approximately equal to said major distance, said gate electrode means also being positioned so that said gate electrode means and said source electrode means are at least partially overlapping in a superimposed relationship to one another and their closest portions are separated from one another, in a direction normal to said lateral direction, by a minor distance, charge carrier transport means supported by said substrate and positioned to extend laterally between and be in intimate physical and electrical contact with said source electrode means and said drain electrode means, and said charge carrier transport means also being interposed between said source electrode means and said gate electrode means, said charge carrier transport means being made of a nonsingle crystalline material having substantially intrinsic semiconductor properties, and dielectric means supported by said substrate and interposed between said gate electrode means and said charge carrier transport means.

15. The thin film high voltage transistor as defined in claim 14 characterized in that the closest portions of said gate electrode means and said drain electrode means are separated from one another, in the lateral direction, by less than said major distance.

16. The thin film high voltage transistor as defined in claim 14 characterized in that the closest portions of said gate electrode means and said drain electrode means are separated from one another, in the lateral direction, by more than said major distance.

17. The thin film high voltage transistor as defined in claim 14 characterized in that the closest portions of said gate electrode means and said drain electrode means are separated from one another, in the lateral direction, by said major distance.

18. The thin film high voltage transistor as defined in claim 14 characterized in that said charge carrier transport means comprises an amorphous silicon layer.

19. A solid state electronic device characterized by including a substrate upon which are supported
    means for transporting charge carriers, comprising a thin film layer of non-single crystalline material having substantially intrinsic semiconductor properties,
    means for providing charge carriers for injection into said means for transporting, said means for providing being positioned in physical and electrical contact with said means for transporting,
    means for collecting charge carriers from said means for transporting, said means for collecting being positioned in physical and electrical contact with said means for transporting and being separated from said means for providing, in the planar direction of said means for transporting, by a channel portion of said means for transporting, and
    means for controlling the rate of injection of charge carriers, separated from said means for transporting by a dielectric layer and positioned in facing relationship to said means for providing, and separated therefrom by the thicknesses of said thin film transport layer and said dielectric layer, said means for controlling also being separated from said means for collecting, in the planar direction of said means for transporting, by approximately the length of said channel portion.

20. The solid state electronic device as defined in claim 19 characterized in that in its ON and OFF states the resistance of said channel portion is essentially unaffected by the voltage applied to said means for controlling.

* * * * *